(12) United States Patent
Hsieh (10) Patent No.: US 6,737,927 B2
(45) Date of Patent: May 18, 2004

(54) DUTY CYCLE CORRECTION CIRCUIT FOR USE WITH FREQUENCY SYNTHESIZER

(75) Inventor: Yi-Bin Hsieh, Taipei (TW)

(73) Assignee: Via Technologies, Inc., Taipei (TW)

( * ) Notice: Subject to any disclaimer, the term of this patent is extended or adjusted under 35 U.S.C. 154(b) by 18 days.

(21) Appl. No.: 10/270,893

(22) Filed: Oct. 15, 2002

(65) Prior Publication Data

US 2003/0102926 A1 Jun. 5, 2003

(30) Foreign Application Priority Data

Dec. 4, 2001 (TW) .................................... 90221097 U (51) Int. Cl.$^7$ ................................................ H03B 1/00
(52) U.S. Cl. .......................... 331/74; 331/1 A; 331/34; 327/113; 327/115; 327/172; 327/175; 327/176; 327/107; 377/47
(58) Field of Search ........................... 331/1 A, 74, 34; 327/113, 115, 172, 175, 176, 107; 377/47

(56) References Cited

U.S. PATENT DOCUMENTS 6,404,840 B1 * 6/2002 Sindalovsky ................. 377/48

* cited by examiner

Primary Examiner—Arnold Kinkead
(74) Attorney, Agent, or Firm—Volpe and Koenig, P.C.

(57) ABSTRACT

A duty cycle correction circuit is provided for converting a pair of differential analog signals from an oscillator into an output pulse signal with 50% of duty cycle. The pulse signal has the same frequency as that of each of the differential analog signals. The duty cycle correction circuit includes a first differential-to-single-ended buffer circuit, a second differential-to-single-ended buffer circuit, a first frequency divider, a second frequency divider and a symmetrical exclusive OR element. The first and the second differential-to-single-ended buffer circuits are used for processing the pair of differential analog signals into a first and a second digital pulse signals, respectively. The first and the second frequency dividers are employed for frequency-dividing the first and the digital pulse signal into a third and a fourth digital pulse signal, respectively. The symmetrical exclusive OR element is used for performing an exclusive OR operation so as to produce the output pulse signal.

14 Claims, 9 Drawing Sheets

DUTY CYCLE CORRECTION CIRCUIT FOR USE WITH FREQUENCY SYNTHESIZER

FIELD OF THE INVENTION

The present invention relates to a duty cycle correction circuit, and more particularly to a duty cycle correction circuit for use with a frequency synthesizer.

BACKGROUND OF THE INVENTION

Figure 1A:
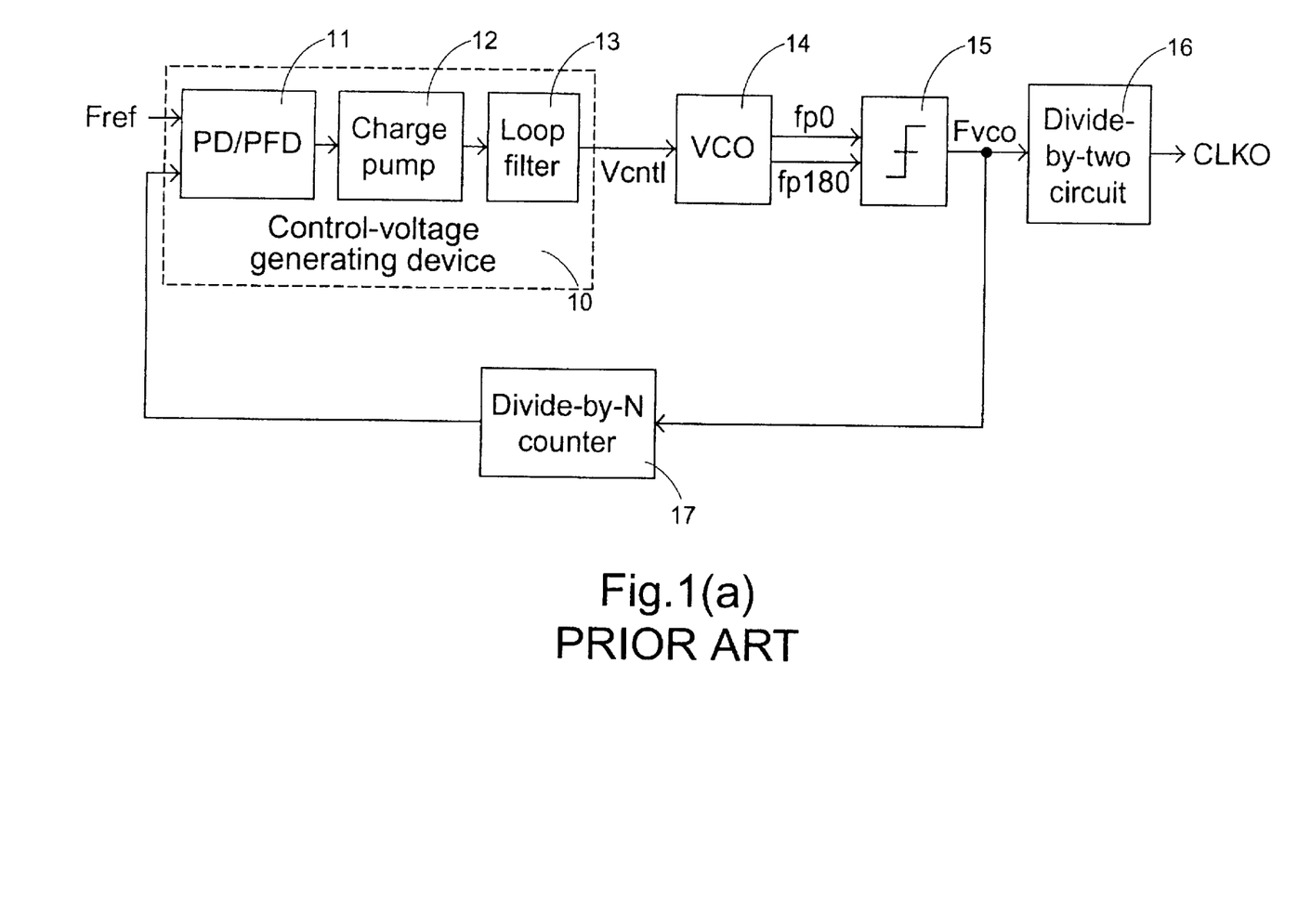
FIG. 1(a) is a functional block diagram of a typical frequency synthesizer.

FIG. 1(a) is a functional block diagram of a conventional frequency synthesizer. A control-voltage signal Vcntl is delivered from a control-voltage generating device 10, which is composed of a phase detector (PD) or a phase-frequency detector (PFD) 11, a charge pump 12 and a loop filter 13, into a voltage-control oscillator (VCO) 14. In accordance with the voltage level of the control-voltage signal Vcntl, the voltage-control oscillator (VCO) 14 delivers a pair of differential analog signals fp0 and fp180 into a differential-to-single-ended buffer circuit 15. The differential analog signals fp0 and fp180 are converted into a single-ended signal and further amplified into a digital signal Fvco by means of the differential-to-single ended buffer circuit 15. Such digital signal Fvco is fed back into the phase detector (PD) or the phase-frequency detector (PFD) 11 by a divided-by-N counter 17 to be compared with a reference frequency signal Fref and thus control the voltage level of the control-voltage signal Vcntl. Therefore, a digital signal Fvco with a stable waveform is obtained in accordance with the relation of Fvco=Fref×N.

Figure 2:
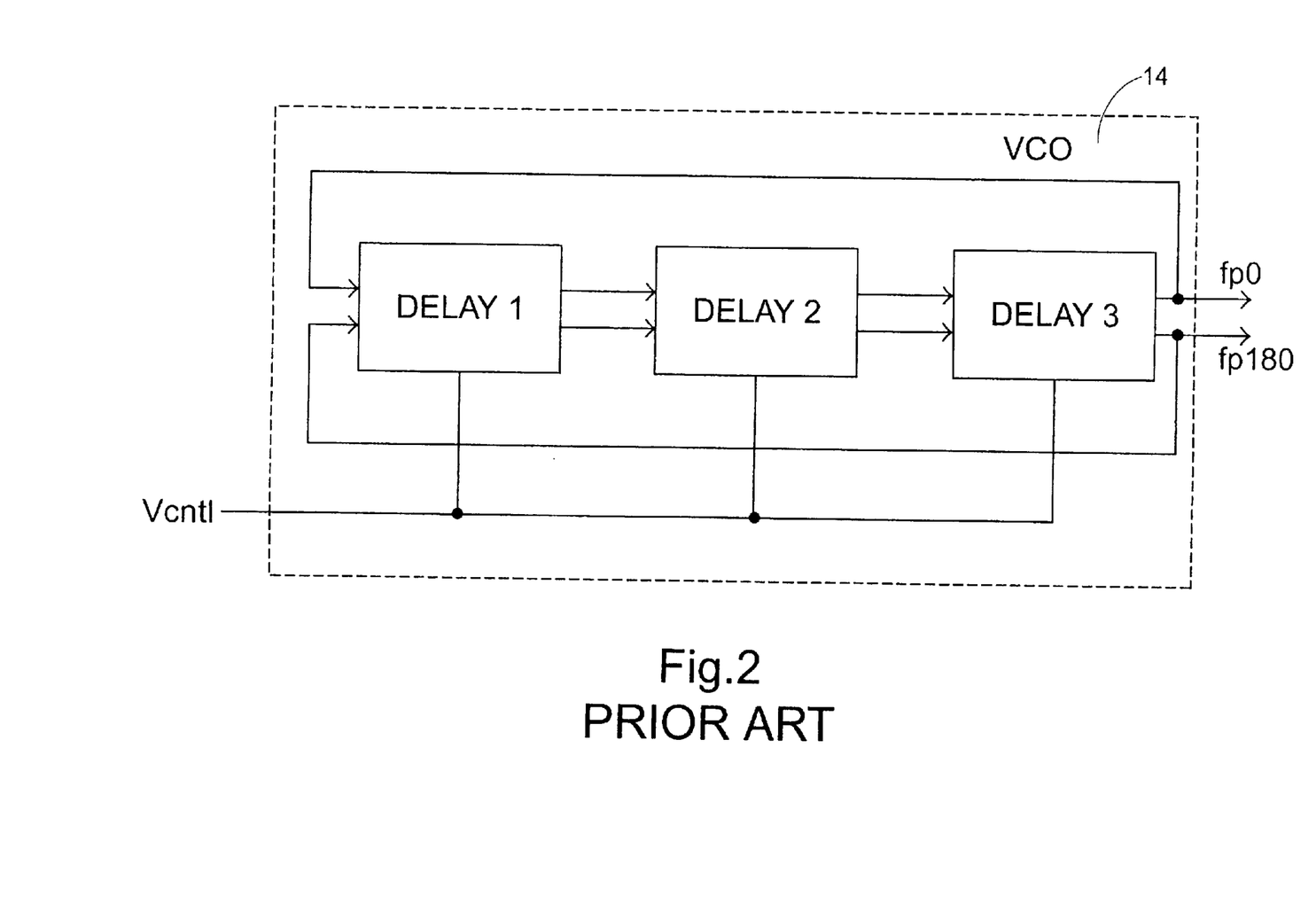
FIG. 2 is a simplified circuit diagram of a voltage-control oscillator of the frequency synthesizer in FIG. 1.
Figure 3:
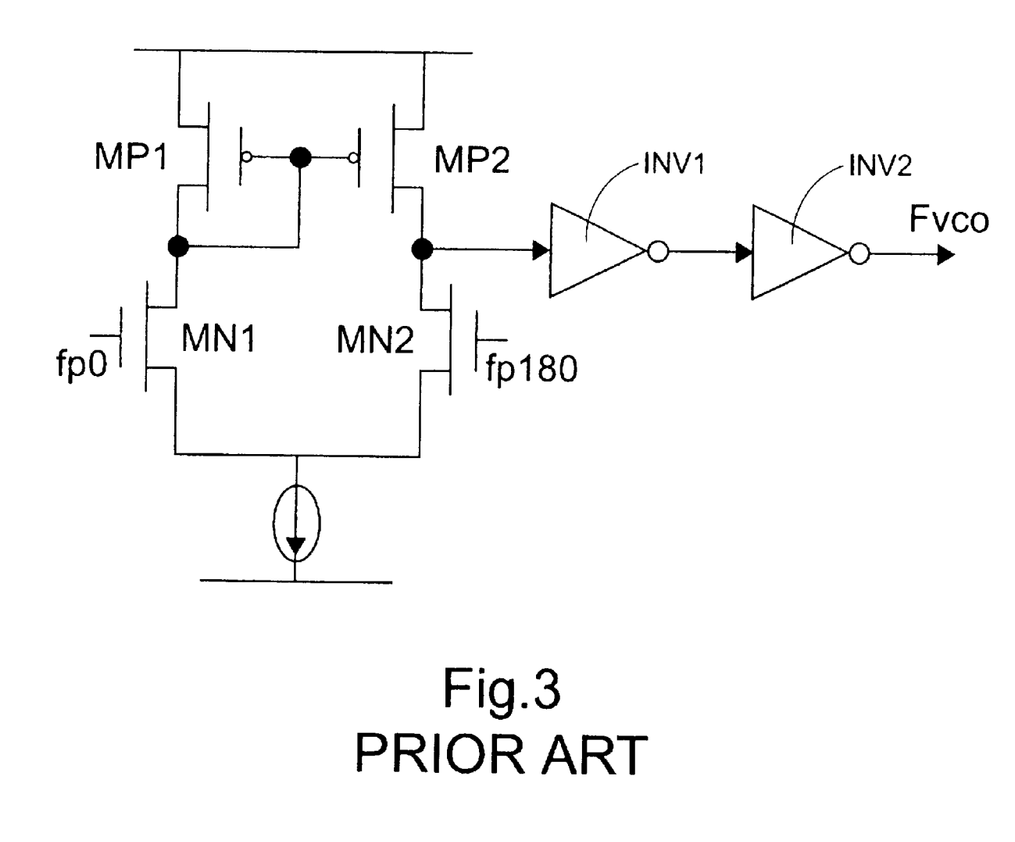
FIG. 3 is a detailed circuit diagram of a differential-to-single-ended buffer circuit of the frequency synthesizer in FIG. 1.

FIGS. 2 and 3 are respectively circuit diagrams of the voltage-control oscillator 14 and the differential-to-single-ended buffer circuit 15. The voltage-control oscillator 14 includes three delay circuits DELAY 1, DELAY 2 and DELAY 3 for processing the control-voltage signal Vcntl and thus outputting the pair of differential analog signals fp0 and fp180. The differential-to-single-ended buffer circuit 15 is implemented by employing four MOSFETs (Metal Oxide Semiconductor Field Effect Transistors), i.e. MN1, MN2, MP1 and MP2, and two inverters, i.e. INV1 and INV2. The operation and principle of the differential-to-single-ended buffer circuit 15 are well known in the art and need not be further described in details herein. Since the loads on the drain terminals MN1 and MN2 are asymmetrical, the duty cycle would possibly be distorted. In addition, the bandwidth of the differential-to-single-ended buffer circuit 15 might vary with the extrinsic parameters, for example device processing temperature, voltage and/or frequency of the frequency synthesizer, the variation of which also distorts the duty cycle. Especially when the frequency synthesizer is operated at different frequencies, the duty cycle distortion is beyond control. For example, the data transfer rate of a CD-ROM/DVD-ROM read-out circuit for the radially outer portion of a disc is approximately 2.5 times as large as that for the radially inner portion. Therefore, the duty cycle distortion occurs due to the frequency difference in the same oscillator. For the above reasons, it is difficult to effectively maintain the duty cycle of the digital signal Fvco at 50%.

Figure 1B:
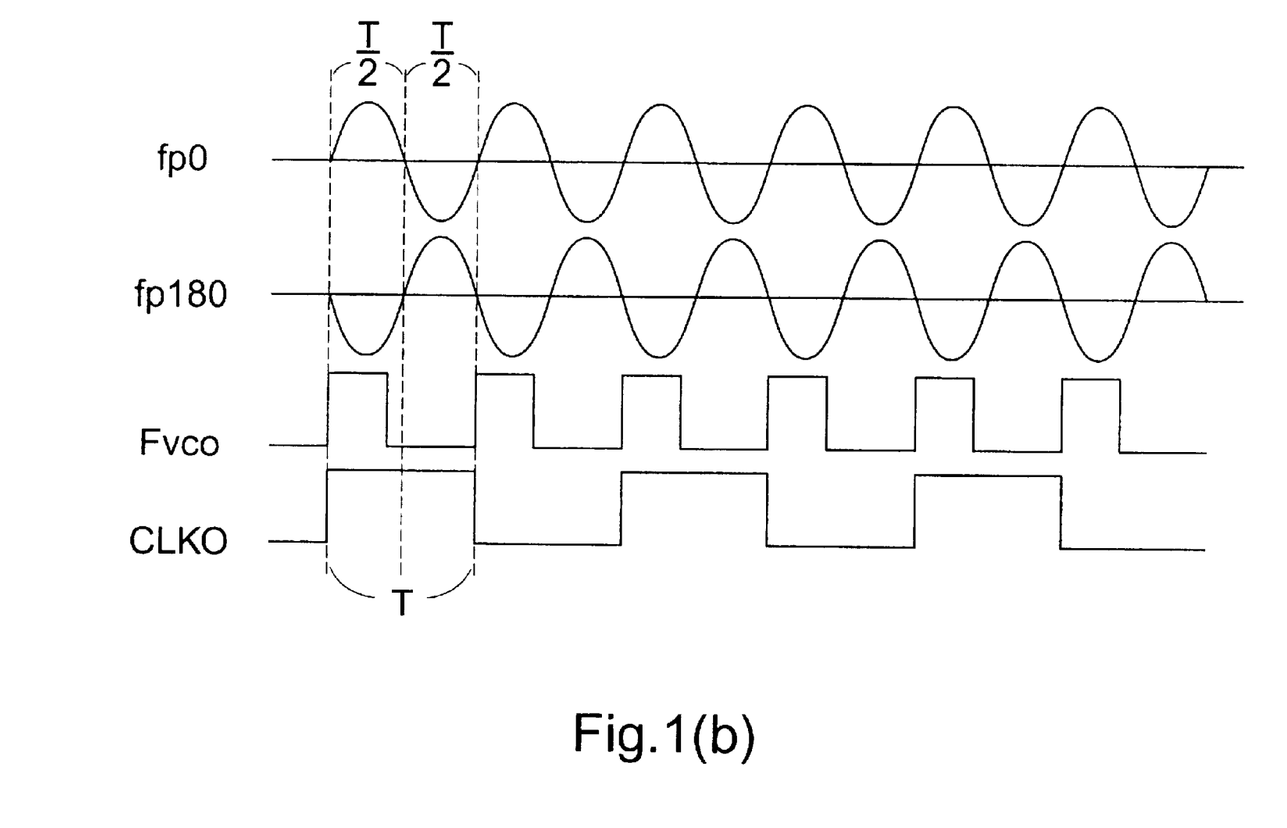
FIG. 1(b) is a timing waveform diagram illustrating the corresponding signals processed by the divide-by-two circuit in FIG. 1(a)

The distortion of the duty cycle of the digital signal Fvco away from 50% will result in a poor bit-error rate and an inferior lock-in range of a clock and data recovery circuit, and is thus required to be improved. The prior art with reference to FIG. 1(a) uses a divide-by-two circuit 16 connected with the differential-to-single-ended buffer circuit 15 to solve this problem. By dividing the frequency of the digital signal Fvco by two, the duty cycle distortion can be disregarded, and a pulse signal CLKO of a duty cycle 50% is obtained, as shown in FIG. 1(b).

However, the circuit configuration of the above frequency synthesizer has some disadvantages. For example, the frequency of the digital signal Fvco has to double in advance in order to obtain the pulse signal CLKO of a desired frequency. Thus, the power consumption of the frequency synthesizer and the complexity of the divide-by-two circuit 16 are increased. This disadvantage is apparent especially when the working frequency of the current central processing unit (CPU) is as high as several gigahertz.

SUMMARY OF THE INVENTION

Therefore, the present invention provides a duty cycle correction circuit for use with a frequency synthesizer, which facilitates reducing power consumption and circuit complexity and still allows the output pulse signal to be fixed at a 50% duty cycle.

In accordance with an aspect of the present invention, there is provided a duty cycle correction circuit for converting a pair of differential analog signals from an oscillator into an output pulse signal with 50% of duty cycle. The pulse signal has the same frequency as that of each of the differential analog signals. The duty cycle correction circuit includes a first differential-to-single-ended buffer circuit, a second differential-to-single-ended buffer circuit, a first frequency divider, a second frequency divider and a symmetrical exclusive OR element. The first differential-to-single-ended buffer circuit is used for processing the pair of differential analog signals into a first digital pulse signal. The second differential-to-single-ended buffer circuit is used for processing the pair of differential analog signals into a second digital pulse signal, wherein the first digital pulse signal and the second digital pulse signal have a specified phase difference therebetween. The first frequency divider is electrically connected with the first differential-to-single-ended buffer circuit for frequency-dividing the first digital pulse signal into a third digital pulse signal. The second frequency divider is electrically connected with the second differential-to-single-ended buffer circuit for frequency-dividing the second digital pulse signal into a fourth digital pulse signal. The symmetrical exclusive OR element is electrically connected with the first frequency divider and the second frequency divider for performing an exclusive OR operation so as to produce the output pulse signal.

In an embodiment, the specified phase difference is 180 degrees. The first frequency divider and the second frequency divider respectively include a first divide-by-two circuit and a second divide-by-two circuit.

For example, the symmetrical exclusive OR element includes a first inverter, a second inverter, a first NAND gate, a second NAND gate, and a third NAND gate. An output end of the first inverter is electrically connected with a first input end of the first NAND gate, an output end of the second inverter is electrically connected with a first input end of the second NAND gate, and an output end of the first NAND gate and an output end of the second NAND gate are respectively connected with a first input end and a second input end of the third NAND gate. The third digital pulse signal is inputted into the first inverter and a second input end of the second NAND gate, and the fourth digital pulse signal is inputted into the second inverter and a second input end of the first NAND gate.

Preferably, the third NAND gate is a symmetrical NAND gate. In an embodiment, the third NAND gate is implemented by a first PMOS transistor, a second PMOS transistor, a first NMOS transistor, a second NMOS transistor, a third NMOS transistor, and a fourth NMOS transistor, the first PMOS transistor is connected with the first NMOS transistor and the second NMOS transistor in series, the second PMOS transistor is connected with the third NMOS transistor and the fourth NMOS transistor in series, the source terminals of the first PMOS transistor and the second PMOS transistor are connected to a power supply voltage, and the source terminals of the second NMOS transistor and the fourth NMOS transistor are grounded. The gate terminals of the first PMOS transistor, the first NMOS transistor and the fourth NMOS transistor are interconnected to form the first input end of the third NAND gate. The gate terminals of the second PMOS transistor, the second NMOS transistor and the third NMOS transistor are interconnected to form the second input end of the third NAND gate, and the drain terminals of the first PMOS transistor and the second PMOS transistor are interconnected to form the output end of the third NAND gate.

In accordance with another aspect of the present invention, there is provided a frequency synthesizer having the above-described duty cycle correction circuit.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 4:
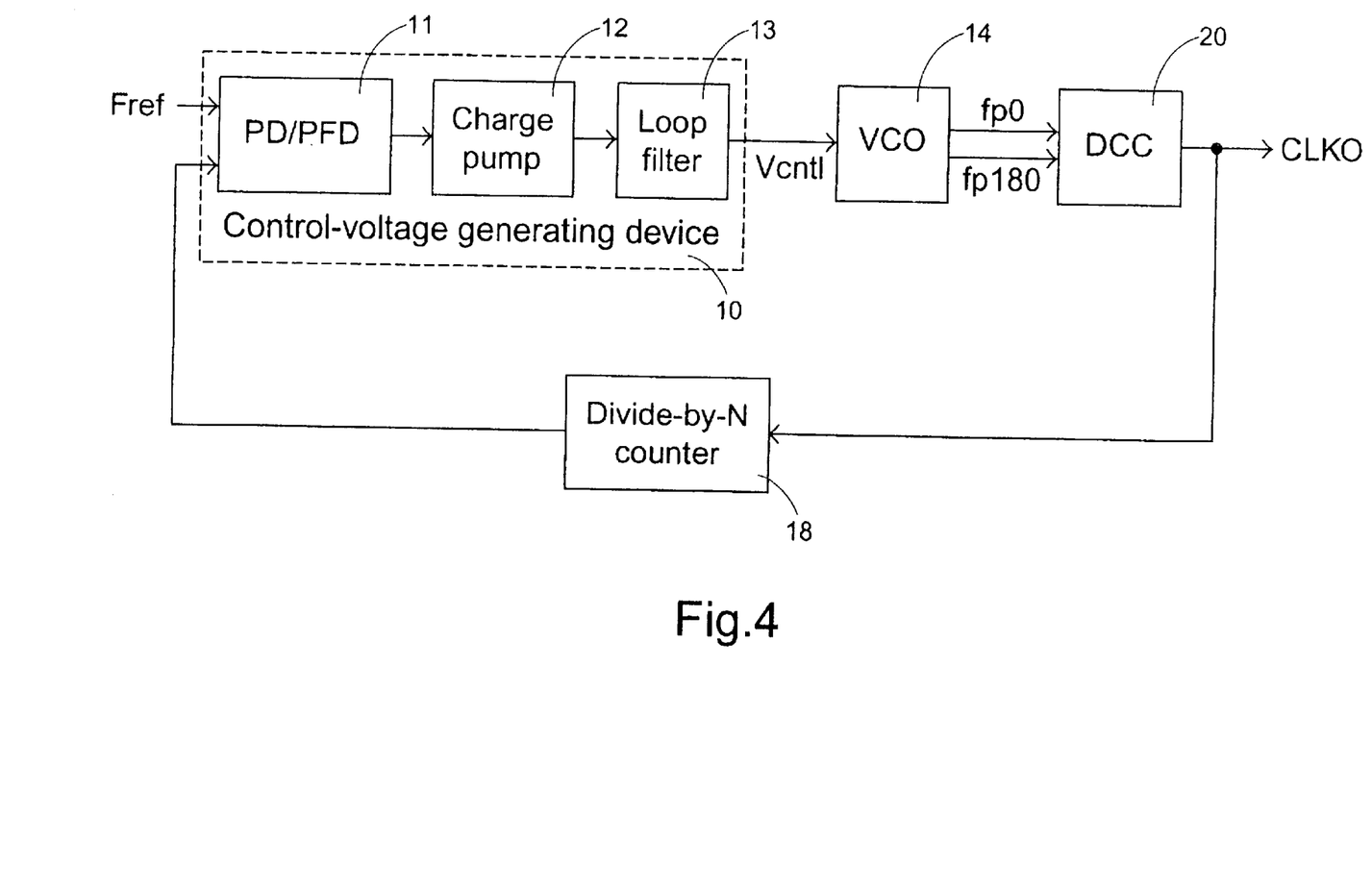
FIG. 4 is a functional block diagram of a frequency synthesizer according to a preferred embodiment of the present invention.

FIG. 4 is a functional block diagram showing a frequency synthesizer according to a preferred embodiment of the present invention. A control-voltage signal Vcntl is delivered from a control-voltage generating device 10, which is composed of a phase detector (PD) or a phase-frequency detector (PFD) 11, a charge pump 12 and a loop filter 13, into a voltage-control oscillator (VCO) 14. In accordance with the voltage level of the control-voltage signal Vcntl, the voltage-control oscillator (VCO) 14 delivers a pair of differential analog signals fp0 and fp180 into a differential-to-single-ended buffer circuit 15, wherein there is a phase difference of 180 degree between the signals fp0 and fp180. The differential analog signals fp0 and fp180 are processed by a duty cycle correction (DCC) circuit 20 so as to produce a pulse signal CLKO of a duty cycle 50%. The pulse signal CLKO is fed back into the phase detector (PD) or the phase-frequency detector (PFD) 11 by a divided-by-N counter 17 to be compared with a reference frequency signal Fref and thus control the voltage level of the control-voltage signal Vcntl. Therefore, a digital signal CLKO with a stable waveform is obtained in accordance with the relation of CLKO=Fref×N.

Figure 5A:
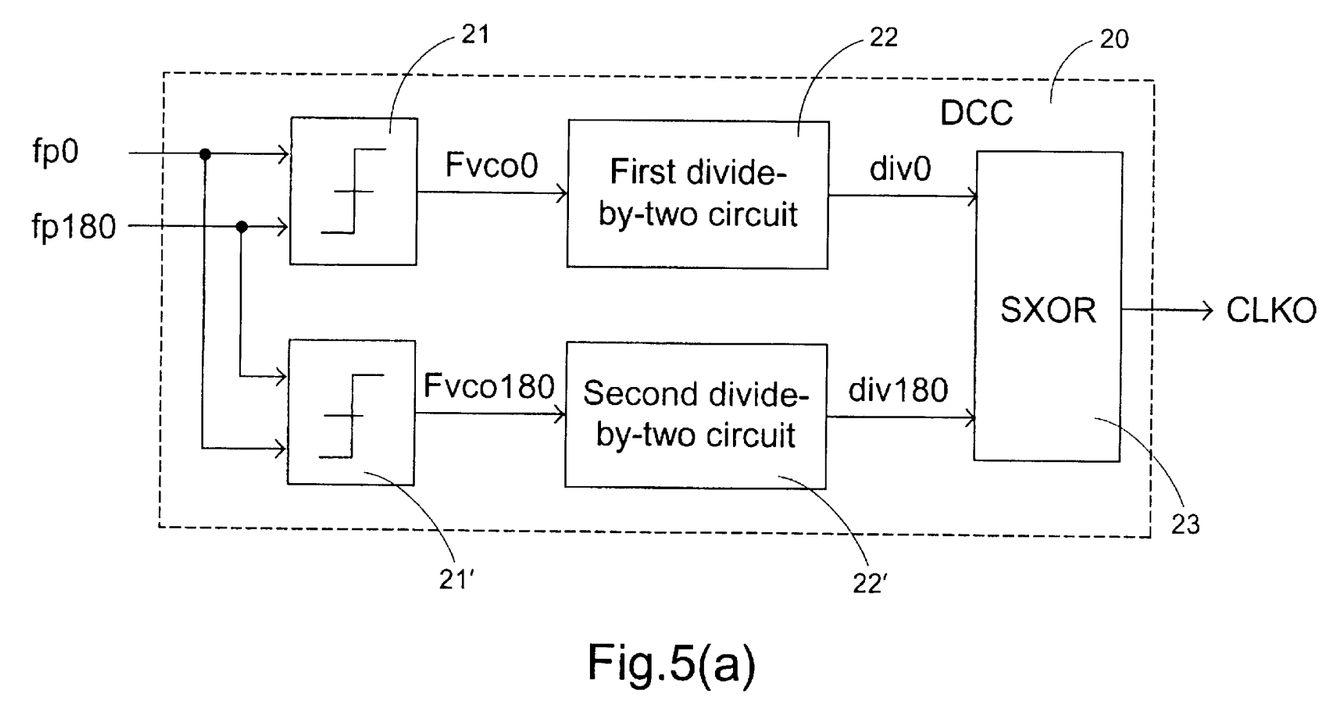
FIG. 5(a) is a block functional diagram of a duty cycle correction circuit in FIG. 4.
Figure 5B:
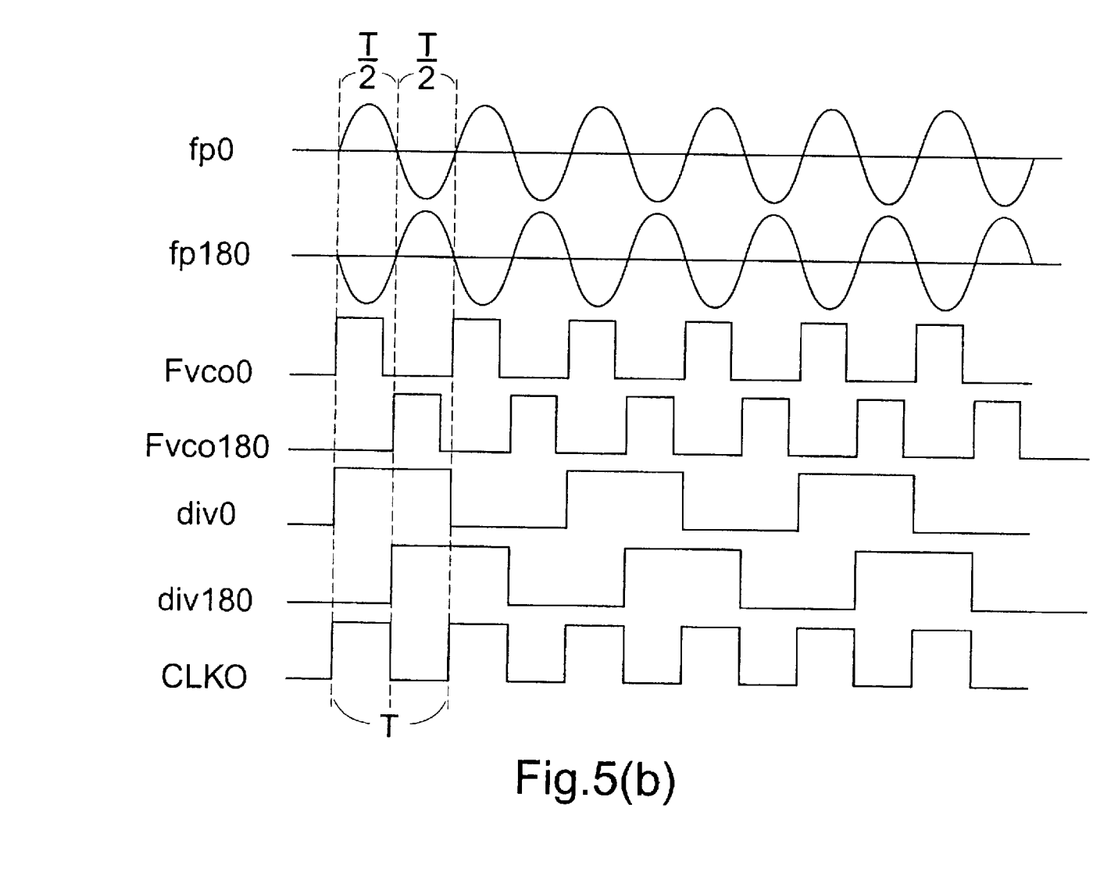
FIG. 5(b) is a timing waveform diagram illustrating the corresponding signals processed by the duty cycle correction circuit in FIG. 4.

Please refer to FIGS. 5(a) and 5(b). The pair of differential analog signals fp0 and fp180 with a period T delivered from the voltage-control oscillator 14 are processed, by a first differential-to-single-ended buffer circuit 21 and a second differential-to-single-ended buffer circuit 21', into a first digital pulse signal Fvco0 and a second digital pulse signal Fvco180, respectively. Although the digital pulse signals Fvco0 and Fvco180 are not fixed at a 50% duty cycle, as can be seen in FIG. 5(b), the phase difference between their rising edges is still 180 degrees. Subsequently, the digital pulse signals Fvco0 and Fvco180 are frequency-divided, by a first divide-by-two circuit 22 and a second divide-by-two circuit 22', into a third digital pulse signal div0 and a fourth digital pulse signal div180, wherein each of the digital pulse signals div0 and div180 is fixed at a 50% duty cycle. Meanwhile, the frequency is reduced to a half, and the period becomes 2T. The signals div0 and div180 are then inputted into a symmetrical exclusive OR (SXOR) gate 23, and thus an exclusive OR operation is performed therein so as to produce the output pulse signal CLKO. As can be found in FIG. 5(b), the frequency of output pulse signal CLKO is the same as that of the voltage-control oscillator 14, and the duty cycle is corrected into 50%. Therefore, it is not necessary to double the frequency in advance as in the prior art. In such way, the power consumption can be greatly reduced.

Figure 6A:
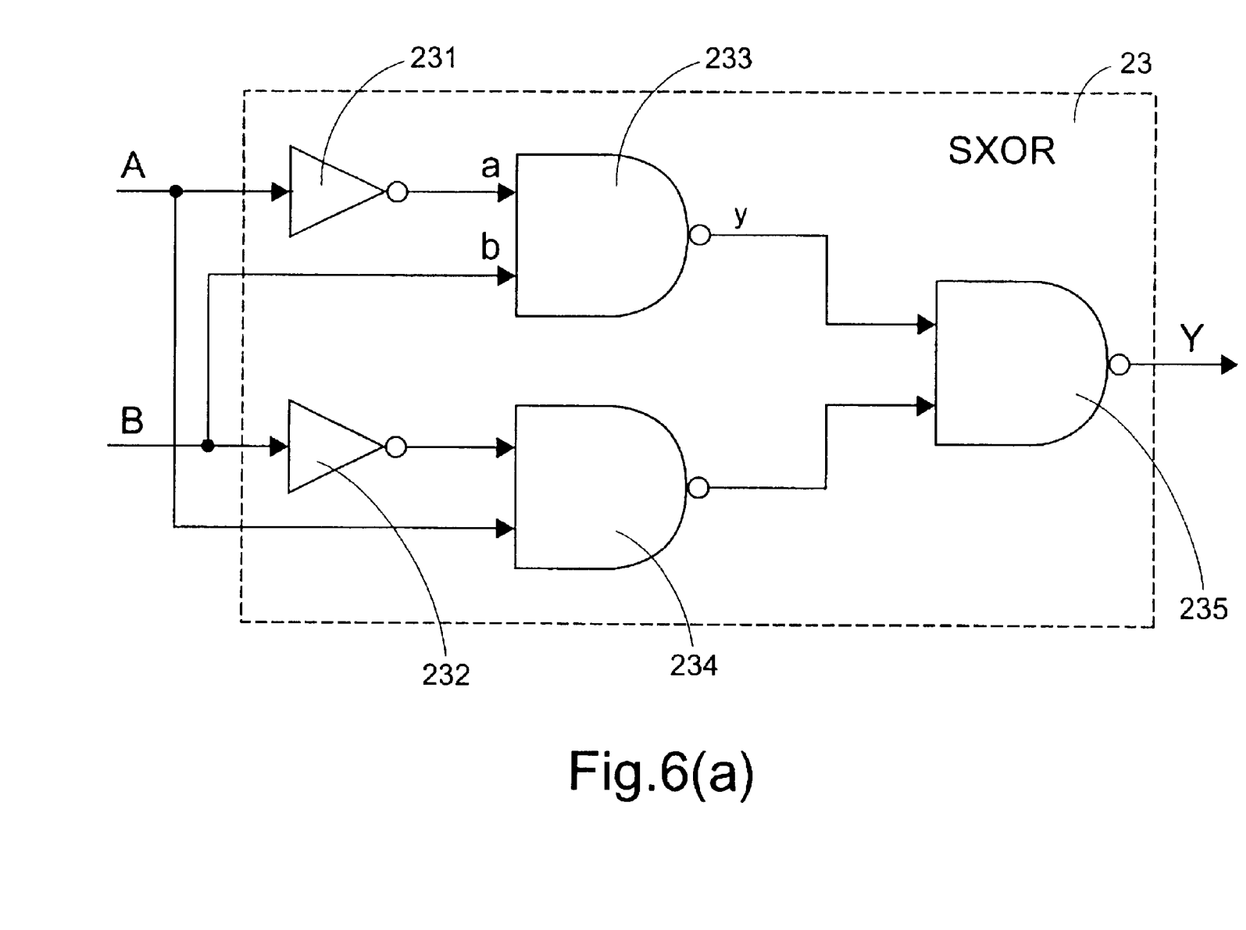
FIG. 6(a) is a logical diagram of a symmetrical exclusive OR gate applied to the duty cycle correction circuit of the present invention.

Referring to the embodiment of FIG. 6(a), the symmetrical exclusive OR gate 23 applied to the duty cycle correction circuit of the present invention includes two inverters 231 and 232, and three symmetrical NAND gates 233, 234 and 235. In another embodiment, the NAND gates 233, 234 can be asymmetrical. By employing this symmetrical exclusive OR gate 23, the delay time between the input signal A and the output signal Y is the same as that between the input signal B and the output signal Y. In FIG. 6(a), the output ends of the inverters 231 and 232 are electrically connected with the first input ends of the NAND gates 233 and 234, respectively. The output ends of the NAND gates 233 and 234 are respectively connected with a first input end and a second input end of the third NAND gate 235. The input signal A is inputted into the inverter 231 and a second input end of the NAND gate 234, and the input signal B is inputted into the inverter 232 and a second input end of the NAND gate 233. It is noted that the signals A, B and Y correspond to the signals div0, div180 and CLKO in FIG. 5(a), respectively.

Figure 6B:
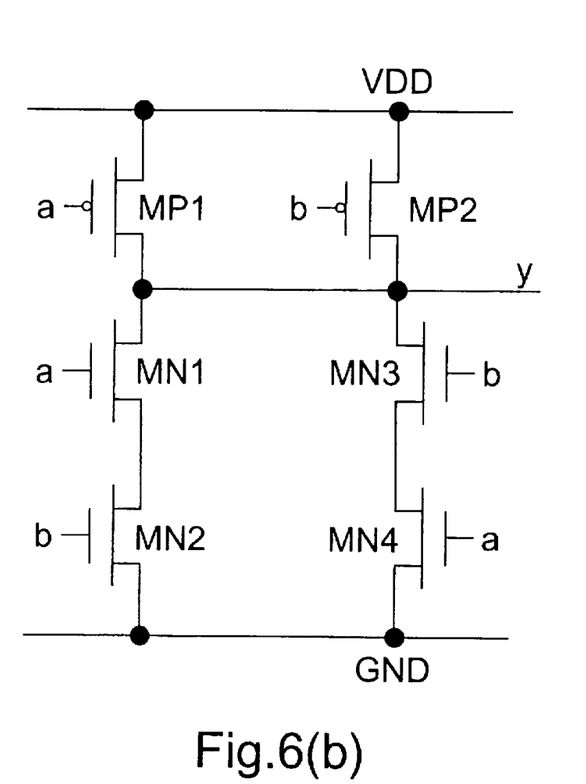
FIG. 6(b) is a detailed circuit diagram of a symmetrical NAND gate in FIG. 6(a).

Referring to FIG. 6(b), each of the symmetrical NAND gates 233, 234 and 235 can be implemented by two PMOS transistors MP1 and MP2 and four NMOS transistors NM1, NM2, NM3 and NM4. The PMOS transistor MP1 is connected with the NMOS transistors MN1 and MN2 in series. The PMOS transistor MP2 is connected with the NMOS transistors NM3 and NM4 in series. The source terminals of MP1 and MP2 are connected to a power supply voltage VDD, and the source terminals of NM2 and NM4 are grounded to GND. The gate terminals of PM1, NM1 and NM4 are interconnected to form a first input end a of the symmetrical NAND gate 233, 234 or 235. The gate terminals of PM2, NM2 and NM3 are interconnected to form a second input end b of the symmetrical NAND gate 233, 234 or 235. The drain terminals of PM1 and PM2 are interconnected to form an output end y of the symmetrical NAND gate 233, 234 or 235. The delay time from point a to y is the same as that from point b to y.

It is understood from the above description, the duty cycle correction circuit of the present invention can allow the output pulse signal CLKO to be fixed at a 50% duty cycle without doubling the frequency of the digital signal Fvco delivered from the oscillator. Therefore, the above-mentioned problems in the prior art can be greatly reduced. Moreover, the duty cycle correction circuit of the present invention can be applied to central processing units (CPUs), chipsets, CDs/DVDs, phase-locked loop and a variety of frequency synthesizers. Especially when it is applied to a clock and data recovery circuit, the bit-error rate and the lock-in range can be greatly enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A duty cycle correction circuit for converting a pair of differential analog signals from an oscillator into an output pulse signal with 50% of duty cycle, said output pulse signal having the same frequency as that of each of said differential analog signals, said duty cycle correction circuit comprising:

a first differential-to-single-ended buffer circuit for processing said pair of differential analog signals into a first digital pulse signal;

a second differential-to-single-ended buffer circuit for processing said pair of differential analog signals into a second digital pulse signal, wherein said first digital pulse signal and said second digital pulse signal have a specified phase difference therebetween;

a first frequency divider electrically connected with said first differential-to-single-ended buffer circuit for frequency-dividing said first digital pulse signal into a third digital pulse signal;

a second frequency divider electrically connected with said second differential-to-single-ended buffer circuit for frequency-dividing said second digital pulse signal into a fourth digital pulse signal; and a symmetrical exclusive OR element electrically connected with said first frequency divider and said second frequency divider for performing an exclusive OR operation so as to produce said output pulse signal.

2. The duty cycle correction circuit according to claim 1 wherein said specified phase difference is 180 degrees.

3. The duty cycle correction circuit according to claim 2 wherein said first frequency divider and said second frequency divider respectively include a first divide-by-two circuit and a second divide-by-two circuit.

4. The duty cycle correction circuit according to claim 1 wherein said symmetrical exclusive OR element includes a first inverter, a second inverter, a first NAND gate, a second NAND gate, and a third NAND gate, wherein an output end of said first inverter is electrically connected with a first input end of said first NAND gate, an output end of said second inverter is electrically connected with a first input end of said second NAND gate, and an output end of said first NAND gate and an output end of said second NAND gate are respectively connected with a first input end and a second input end of said third NAND gate.

5. The duty cycle correction circuit according to claim 4 wherein said third digital pulse signal is inputted into said first inverter and a second input end of said second NAND gate, and said fourth digital pulse signal is inputted into said second inverter and a second input end of said first NAND gate.

6. The duty cycle correction circuit according to claim 4 wherein said third NAND gate is a symmetrical NAND gate.

7. The duty cycle correction circuit according to claim 6 wherein said third NAND gate is implemented by a first PMOS transistor, a second PMOS transistor, a first NMOS transistor, a second NMOS transistor, a third NMOS transistor, and a fourth NMOS transistor, said first PMOS transistor is connected with said first NMOS transistor and said second NMOS transistor in series, said second PMOS transistor is connected with said third NMOS transistor and said fourth NMOS transistor in series, the source terminals of said first PMOS transistor and said second PMOS transistor are connected to a power supply voltage, and the source terminals of said second NMOS transistor and said fourth NMOS transistor are grounded, and wherein the gate terminals of said first PMOS transistor, said first NMOS transistor and said fourth NMOS transistor are interconnected to form said first input end of said third NAND gate;

the gate terminals of said second PMOS transistor, said second NMOS transistor and said third NMOS transistor are interconnected to form said second input end of said third NAND gate; and the drain terminals of said first PMOS transistor and said second PMOS transistor are interconnected to form an output end of said third NAND gate.

8. A frequency synthesizer comprising a control-voltage generating device, an oscillator and a duty cycle correction circuit connected in series, said oscillator delivering a pair of differential analog signals into said duty cycle correction circuit to be converted into an output pulse signal with a duty cycle of substantially 50%, said output pulse signal having the same frequency as that of each of said differential analog signals, said duty cycle correction circuit comprising:

a first differential-to-single-ended buffer circuit for processing said pair of differential analog signals into a first digital pulse signal;

a second differential-to-single-ended buffer circuit for processing said pair of differential analog signals into a second digital pulse signal, wherein said first digital pulse signal and said second digital pulse signal have a specified phase difference therebetween;

a first frequency divider electrically connected with said first differential-to-single-ended buffer circuit for frequency-dividing said first digital pulse signal into a third digital pulse signal;

a second frequency divider electrically connected with said second differential-to-single-ended buffer circuit for frequency-dividing said second digital pulse signal into a fourth digital pulse signal; and a symmetrical exclusive OR element electrically connected with said first frequency divider and a said frequency divider for performing an exclusive OR operation so as to produce said output pulse signal.

9. The frequency synthesizer according to claim 8 wherein said specified phase difference is 180 degrees.

10. The frequency synthesizer according to claim 9 wherein said first frequency divider and said second frequency divider respectively include a first divide-by-two circuit and a second divide-by-two circuit.

11. The frequency synthesizer according to claim 8 wherein said symmetrical exclusive OR element includes a first inverter, a second inverter, a first NAND gate, a second NAND gate, and a third NAND gate, wherein an output end of said first inverter is electrically connected with a first input end of said first NAND gate, an output end of said second inverter is electrically connected with a first input end of said second NAND gate, and an output end of said first NAND gate and an output end of said second NAND gate are respectively connected with a first input end and a second input end of said third NAND gate.

12. The frequency synthesizer according to claim 11 wherein said third digital pulse signal is inputted into said first inverter and a second input end of said second NAND gate, and said fourth digital pulse signal is inputted into said second inverter and a second input end of said first NAND gate.

13. The frequency synthesizer according to claim 11 wherein said third NAND gate is a symmetrical NAND gate.

14. The frequency synthesizer according to claim 13 wherein said third NAND gate is implemented by a first PMOS transistor, a second PMOS transistor, a first NMOS transistor, a second NMOS transistor, a third NMOS transistor, and a fourth NMOS transistor, said first PMOS transistor is connected with said first NMOS transistor and said second NMOS transistor in series, said second PMOS transistor is connected with said third NMOS transistor and said fourth NMOS transistor in series, the source terminals of said first PMOS transistor and said second PMOS transistor are connected to a power supply voltage, and the source terminals of said second NMOS transistor and said fourth NMOS transistor are grounded, and wherein the gate terminals of said first PMOS transistor, said first NMOS transistor and said fourth NMOS transistor are interconnected to form said first input end of said third NAND gate;

the gate terminals of said second PMOS transistor, said second NMOS transistor and said third NMOS transistor are interconnected to form said second input end of said third NAND gate; and the drain terminals of said first PMOS transistor and said second PMOS transistor are interconnected to form an output end of said third NAND gate.

* * * * *